(12) United States Patent
Fan

(10) Patent No.: US 9,659,855 B2
(45) Date of Patent: May 23, 2017

(54) CAVITY PACKAGE WITH PRE-MOLDED SUBSTRATE

(71) Applicant: Ubotic Company Limited, Tsuen Wan (CN)

(72) Inventor: Chun Ho Fan, Tsuen Wan (CN)

(73) Assignee: UBOTIC COMPANY LIMITED, Tsuen Wan (HK)

( * ) Notice: Subject to any disclaimer, the term of this patent is extended or adjusted under 35 U.S.C. 154(b) by 0 days.

(21) Appl. No.: 14/469,811

(22) Filed: Aug. 27, 2014

(65) Prior Publication Data

US 2015/0060116 A1    Mar. 5, 2015

Related U.S. Application Data

(60) Provisional application No. 61/870,352, filed on Aug. 27, 2013.

(51) Int. Cl.
*H01L 23/498* (2006.01)
*H01L 21/48* (2006.01)
(Continued)

(52) U.S. Cl.
CPC .... *H01L 23/49861* (2013.01); *H01L 21/4817* (2013.01); *H01L 21/4825* (2013.01);
(Continued)

(58) Field of Classification Search
CPC ............. H01L 21/4817; H01L 21/4825; H01L 21/4828; H01L 21/4839; H01L 21/4821;
(Continued)

(56) References Cited

U.S. PATENT DOCUMENTS 6,061,251 A    5/2000  Hutchison et al.
6,469,369 B1   10/2002 Lee
(Continued)

FOREIGN PATENT DOCUMENTS

CN   WO 2011103720 A1 *  9/2011   ........... B81B 7/0061
WO   00/28589 A1          5/2000

OTHER PUBLICATIONS

Official Communication issued in corresponding European Patent Application No. 14179605.2, mailed on Apr. 10, 2015.
Official Communication issued in corresponding European Patent Application No. 14182490.4, mailed on Mar. 2, 2015.

*Primary Examiner* — Robert Carpenter
(74) *Attorney, Agent, or Firm* — Keating and Bennett, LLP

(57) ABSTRACT

A cavity package is set forth along with a method of manufacturing thereof. The method comprises applying a selective plating resist to a metallic substrate in a pattern to expose portions for a ring, tie bars, die attach pad and input/output wire bonding pads; elective depositing of metal plating using the selective plating resist; removing the selective metal plating resist; applying a selective etching resist to the substrate; selectively etching portions of the substrate not covered by the selective etching resist; stripping away the selective etching resist; pre-molding a lead-frame to the substrate so as to surround the die attach pad portion; etching the tie bars away from the bottom surface of the substrate; attaching a semiconductor device die to the die attach pad; wire bonding the semiconductor device to the input/output wire bonding pads; and attaching a cap to the ring portion of the substrate and the die attach pad to protect the wire bonded semiconductor device die and permit electrical grounding.

6 Claims, 13 Drawing Sheets

(51) Int. Cl.
*H01L 23/047* (2006.01)
*H01L 23/10* (2006.01)
*H01L 23/495* (2006.01)
*H01L 23/00* (2006.01)

(52) U.S. Cl.
CPC ...... *H01L 21/4828* (2013.01); *H01L 21/4839* (2013.01); *H01L 23/047* (2013.01); *H01L 23/10* (2013.01); *H01L 21/4821* (2013.01); *H01L 23/49582* (2013.01); *H01L 24/73* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC ............... H01L 23/49582; H01L 23/10; H01L 23/49861; H01L 23/047
See application file for complete search history.

(56) References Cited

U.S. PATENT DOCUMENTS

| | | |
|---|---|---|
| 8,063,470 B1 * | 11/2011 | Sirinorakul ......... H01L 21/4832 257/666 |
| 2006/0228832 A1 | 10/2006 | Koh |
| 2011/0140253 A1 * | 6/2011 | Lee ................... H01L 23/49548 257/676 |
| 2012/0058604 A1 | 3/2012 | Chew et al. |
| 2012/0168920 A1 | 7/2012 | Tan et al. |
| 2012/0223622 A1 | 9/2012 | Otsuki |
| 2012/0235308 A1 | 9/2012 | Takahashi |
| 2013/0009299 A1 | 1/2013 | Takada et al. |
| 2013/0087895 A1 | 4/2013 | Upadhyayula et al. |
| 2013/0093031 A1 | 4/2013 | Gao et al. |
| 2013/0228908 A1 | 9/2013 | Takahashi |

* cited by examiner

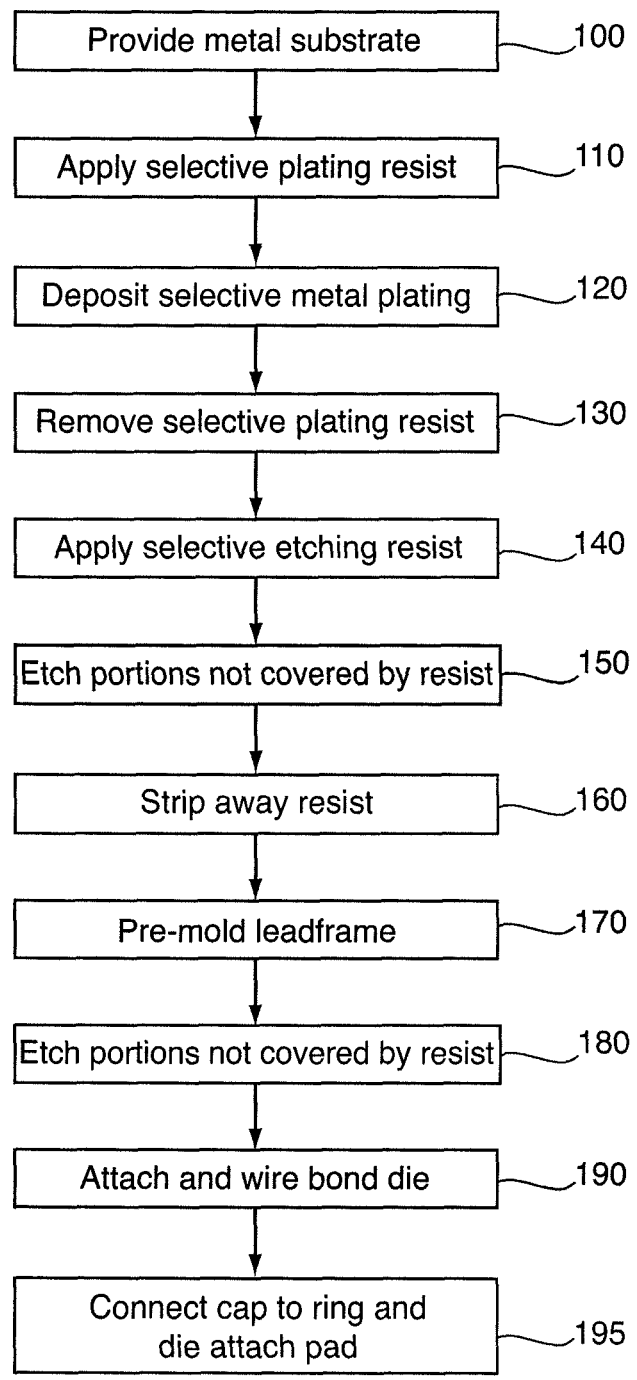

Fig. 4A
Fig. 4B
Fig. 4C
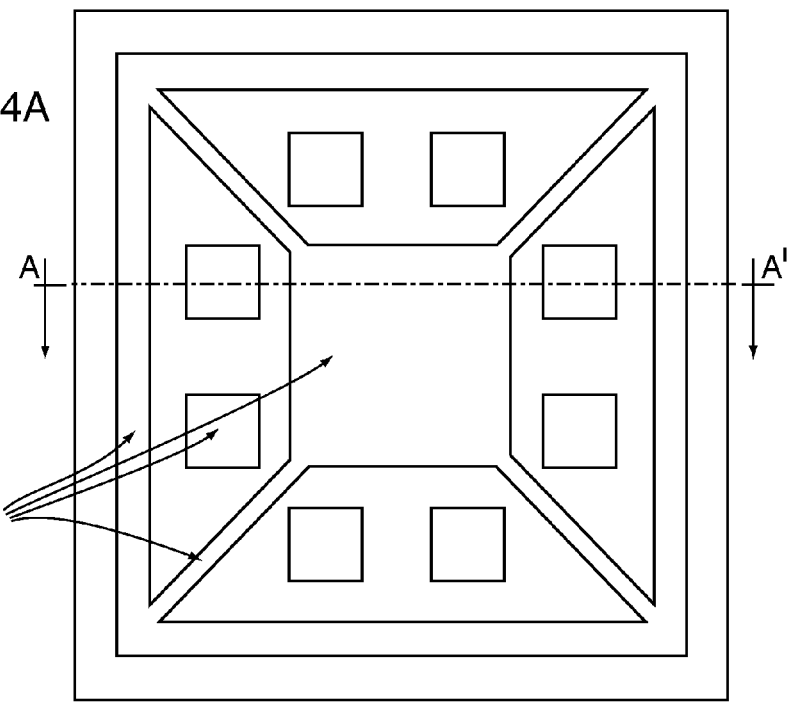
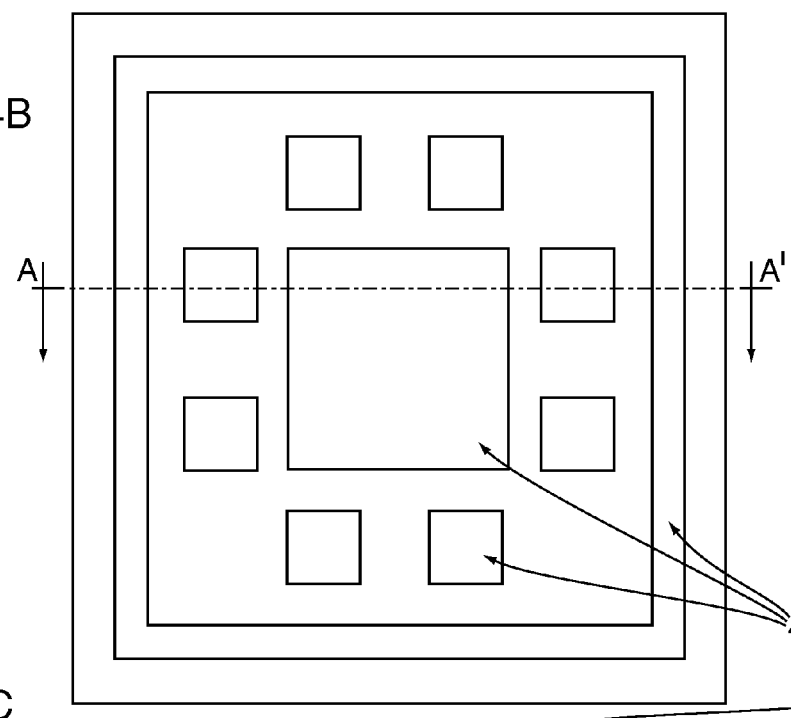
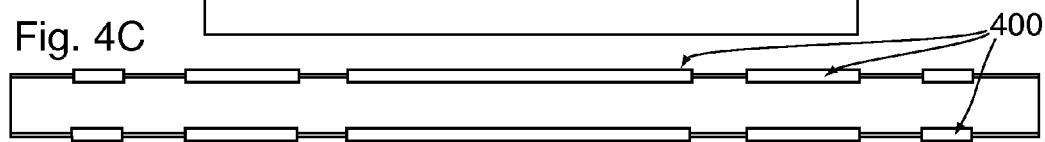

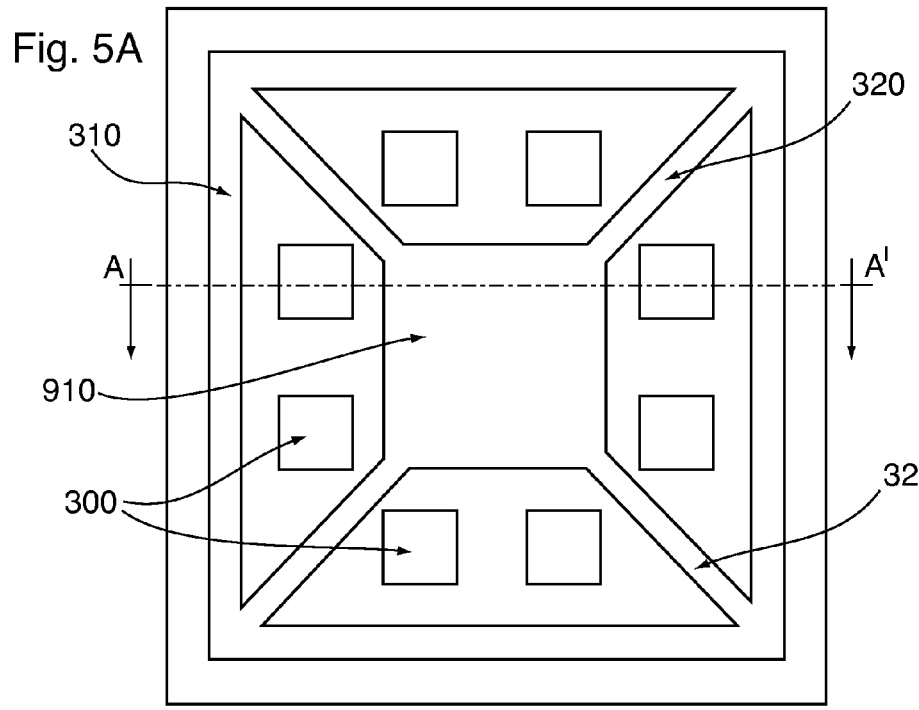
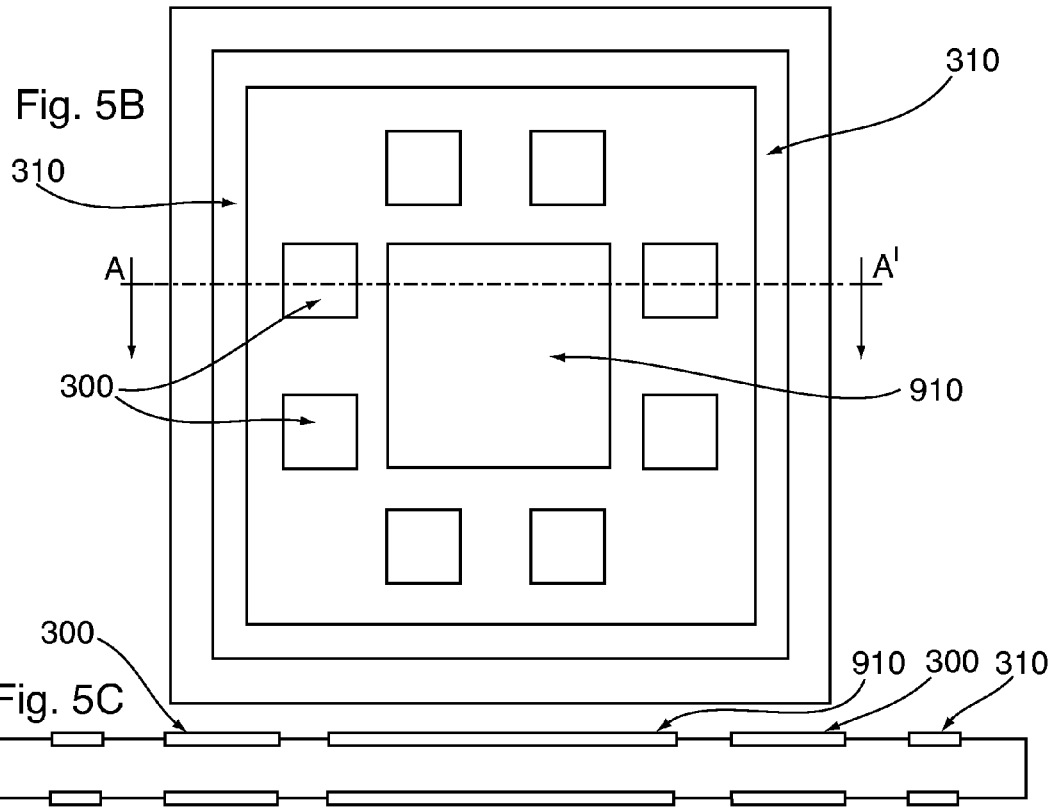

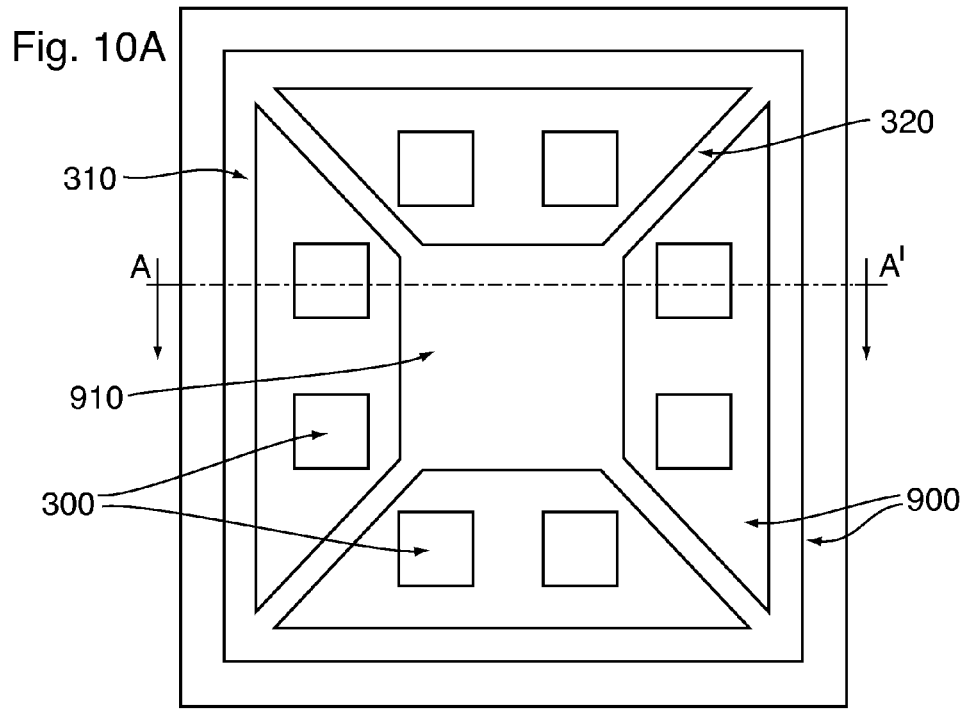
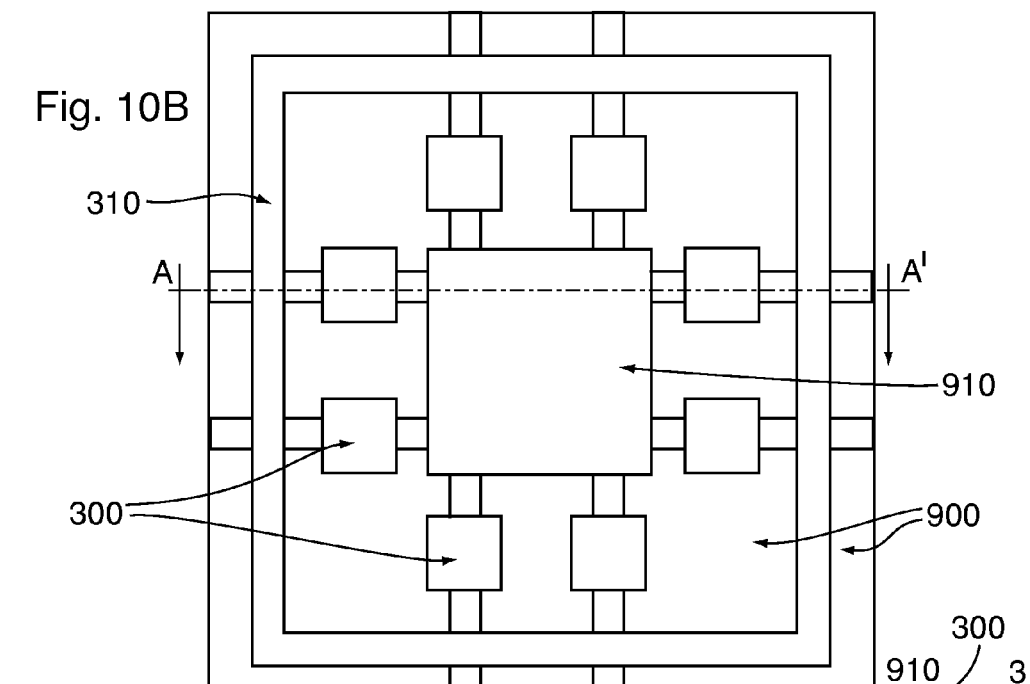
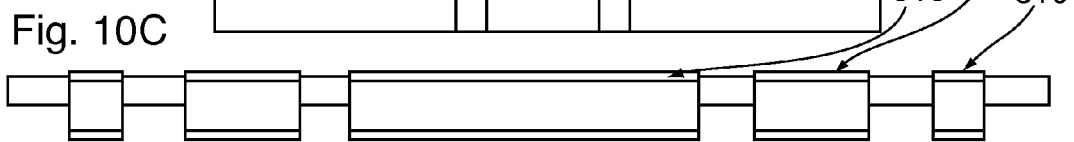

CAVITY PACKAGE WITH PRE-MOLDED SUBSTRATE

RELATED APPLICATIONS

This application claims priority from U.S. patent application 61/870352, filed Aug. 27, 2013. Priority is claimed to this earlier filed application and the contents of this earlier-filed application are incorporated herein, in their entirety, by reference.

FIELD OF INVENTION

The present invention relates generally to integrated circuits, and more particularly to a cavity package with a pre-molded substrate.

BACKGROUND

Flat no-leads packages such as QFN (quad-flat no-leads) and DFN (dual-flat no-leads) are used to physically and electrically connect integrated circuits to printed circuit boards. Two types of flat no-leads packages are common: cavity (i.e. with a cavity designed into the package containing air or nitrogen), and plastic-molded (i.e. with minimal air in the package).

Cavity packages are small and lightweight, with good thermal and electrical performance that makes them suitable for portable communication/consumer products. Applications include cellular phones, PDAs, wireless transmitters, RF front end, HD devices, microcontrollers, pre-amplifiers, servers, smart power suppliers, switches, DSPs, ASICs, MEMS (Micro Mechanical and Electrical System) and wrist watches.

Cavity packages are usually made up of three parts; a copper leadframe, plastic-molded body (open, and not sealed), and a cap or lid attached to the plastic portion of the leadframe. An integrated circuit is mounted to a die attach pad within the cavity, with wire leads connecting the IC to the leadframe. The leadframe terminates in contacts on the bottom of the package for providing electrical interconnection with a printed circuit board.

In conventional cavity packages, a two-metal layer organic laminate is used with a via connecting the top metal layer to the bottom metal layer in order to fabricate an isolated ring.

SUMMARY

Unlike conventional cavity packages, which use a two-metal layer organic laminate substrate and a via to connect the top metal layer to the bottom metal layer, according to an aspect of the invention an isolated ring is fabricated onto a one-metal-layer substrate. All of the necessary metal features such as the ring, the I/O contact pads and the die attach paddle are created and connected together by temporary tie bars, and are then electrically isolated by etching away the temporary tie bars after the leadframe is pre-molded. An electrical ground path is created for the die attach pad and the metal cap through the ring and substrate to a further metal ring surrounding the I/O contact pads on the bottom side of the leadframe. This allows a metal cap to be connected to the pre-molded leadframe via solder reflow, in order to protect the I/O contact pads, wires and the integrated circuit.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 1 is a flowchart showing steps in a process for constructing a cavity package with a pre-molded substrate, according to an exemplary embodiment.

FIGS. 4A-4C are top, bottom and cross-sectional views, respectively, of the substrate of FIGS. 3A-3C after selective metal plating using the selective plating resist, according to a third step of the process set forth in FIG. 1.

FIGS. 5A-5C are top, bottom and cross-sectional views, respectively, of the substrate of FIGS. 4A-4C after removal of the selective plating resist, according to a fourth step of the process set forth in FIG. 1.

FIGS. 10A-10C are top, bottom and cross-sectional views, respectively, of the substrate of FIGS. 9A-9C after etching away of non-plated temporary tie bars on the bottom surface of the substrate, according to a ninth step of the process set forth in FIG. 1.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENTS

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

With reference to FIGS. 1A-1C through 12D-12E, construction of a cavity package with a pre-molded substrate is shown, according to an exemplary embodiment. It should be noted that whereas FIGS. 1A-1C through 12D-12E, show construction of a single cavity package with a pre-molded substrate, in practice a matrix comprising a plurality of cavity packages is fabricated so that multiple packages are fabricated simultaneously and then singulated into individual packages, as discussed in greater detail below.

Figure 2A:
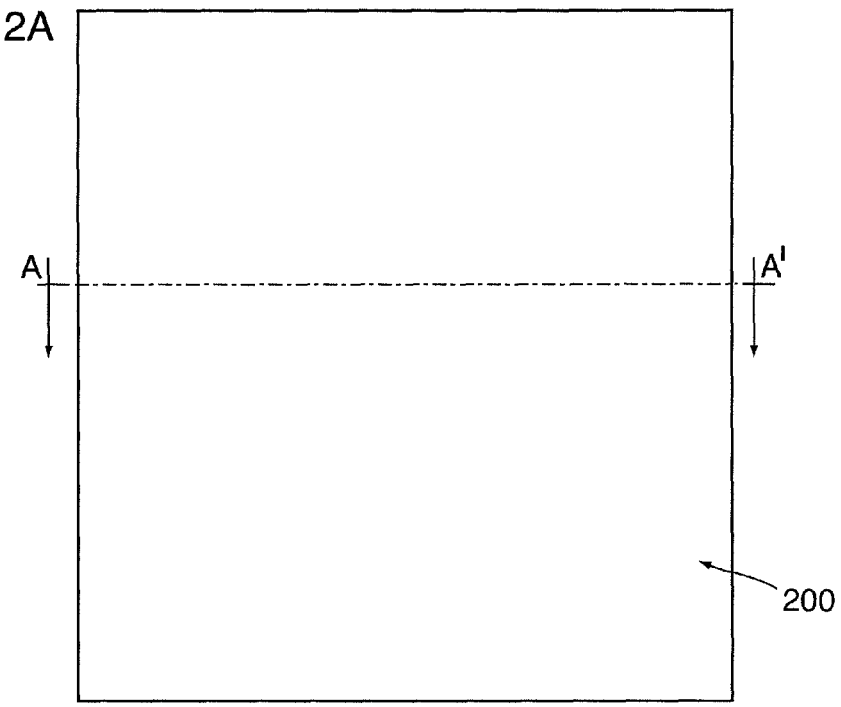
FIGS. 2A-2C are top, bottom and cross-sectional views, respectively, of a raw copper substrate at a first step of the process set forth in FIG. 1.
Figure 2B:
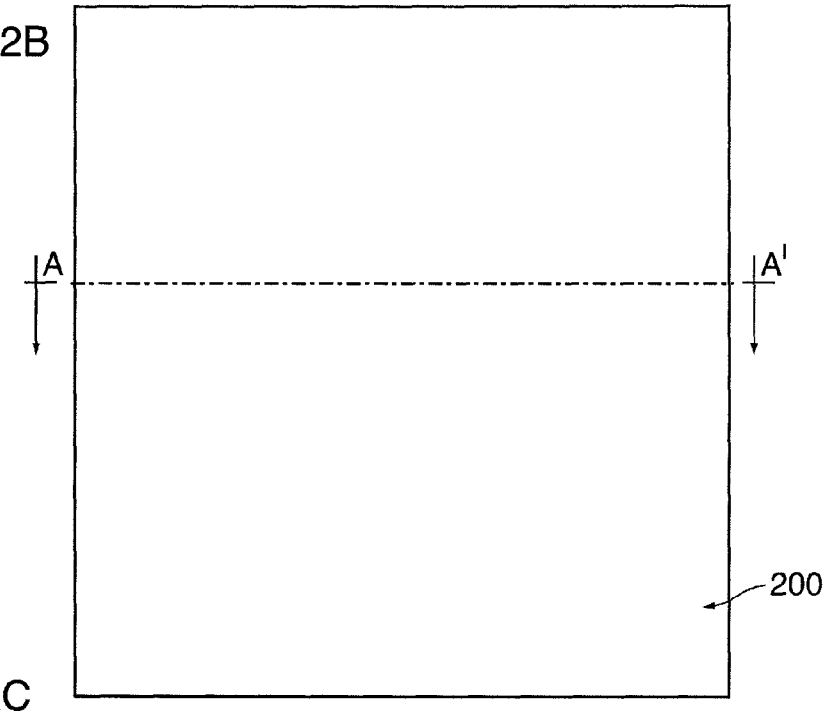
Figure 2C:
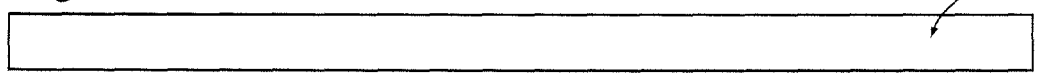

Construction of the cavity package begins at step 100 (FIG. 1) with fabrication of a metal (e.g. Cu) substrate 200, as shown in FIGS. 2A-2C, where FIG. 2C is a cross-section through the line A-A' in FIGS. 2A and 2B.

Figure 3A:
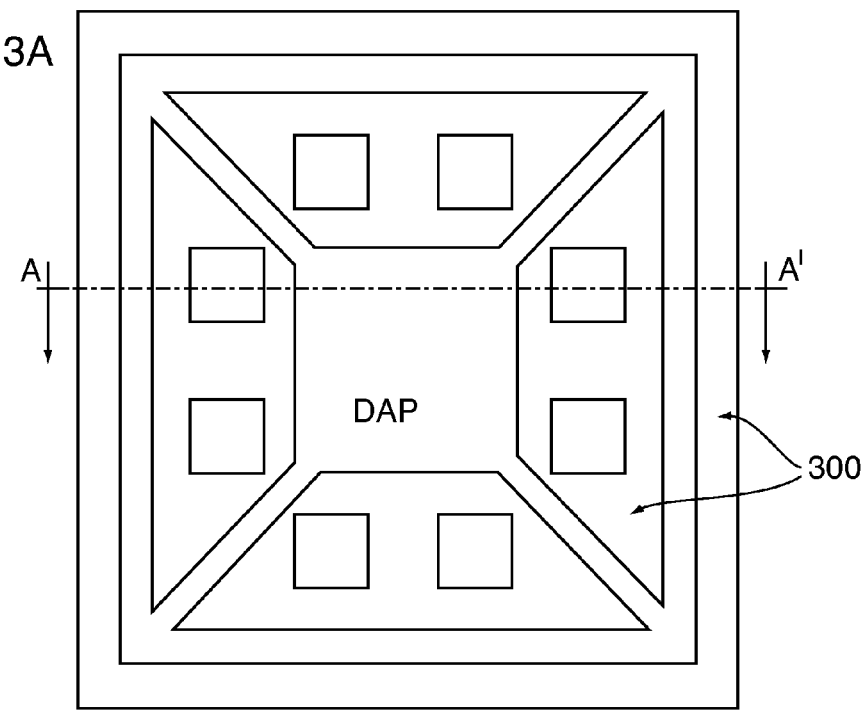
FIGS. 3A-3C are top, bottom and cross-sectional views, respectively, of the substrate of FIGS. 2A-2C after application of a selective plating resist, according to a second step of the process set forth in FIG. 1.
Figure 3B:
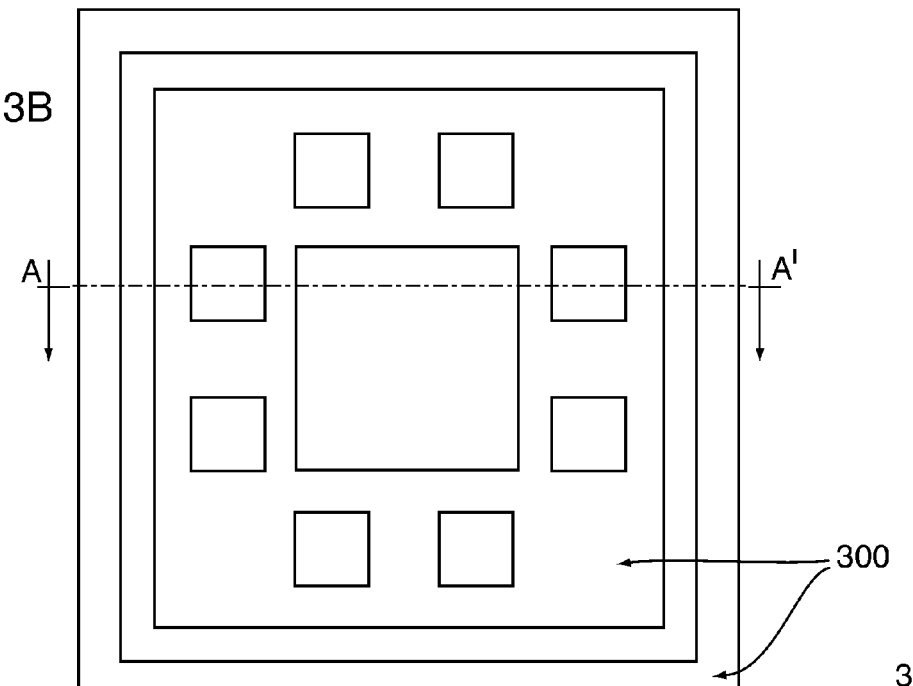
Figure 3C:
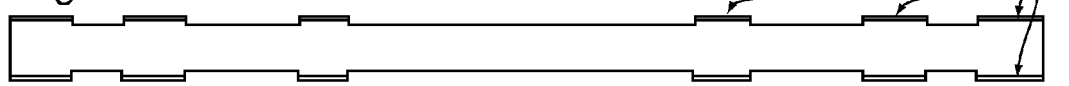

At step 110, a selective plating resist 300 (e.g. Photo-Imageable type) is applied to the substrate 200, as shown in FIGS. 3A-3C, to prepare the substrate for selective metal plating. Exposed portions are shown for a top and bottom surface rings 310, top surface tie bars 320 and top and bottom input/output (I/O) contact pads 330, deposited in step 130 (discussed below).

At step 120, selective metal plating 400 (e.g. Ag, Ni/Au, Ni/Pd/Au, etc.) is deposited using the selective patterned plating resist 300, as shown in FIGS. 4A-4C.

At step 130, the selective metal plating resist 300 is removed, as shown in FIGS. 5A-5C, revealing the top and bottom surface rings 310, top surface tie bars 320, die attach pad 910, and top and bottom input/output (I/O) contact pads 330.

Figure 6A:
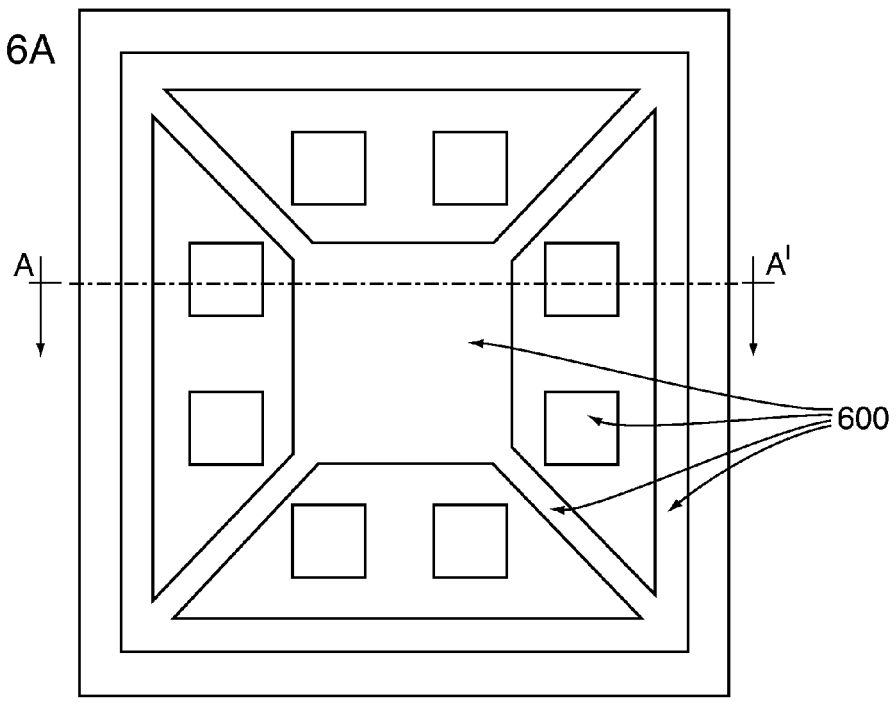
FIGS. 6A-6C are top, bottom and cross-sectional views, respectively, of the substrate of FIGS. 5A-5C after application of a selective etching resist, according to a fifth step of the process set forth in FIG. 1.
Figure 6B:
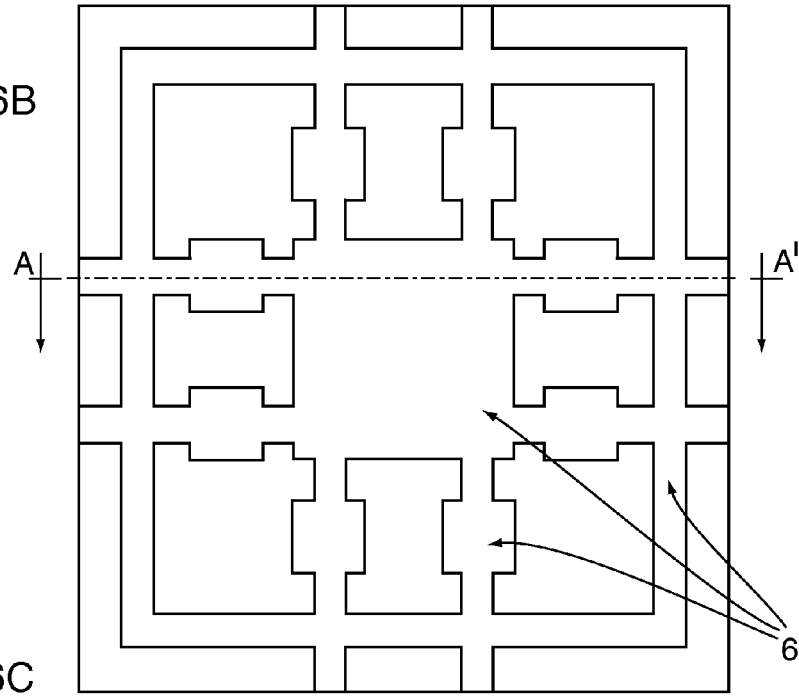
Figure 6C:
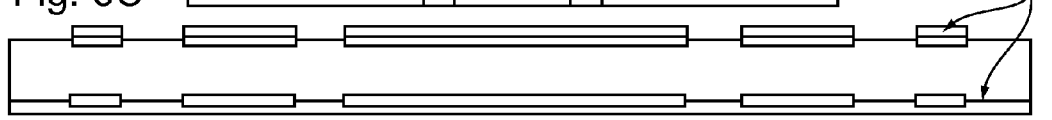

At step 140, a selective etching resist 600 (e.g. Photo-Imageable type) is applied to the substrate 200, as shown in FIGS. 6A-6C.

Figure 7A:
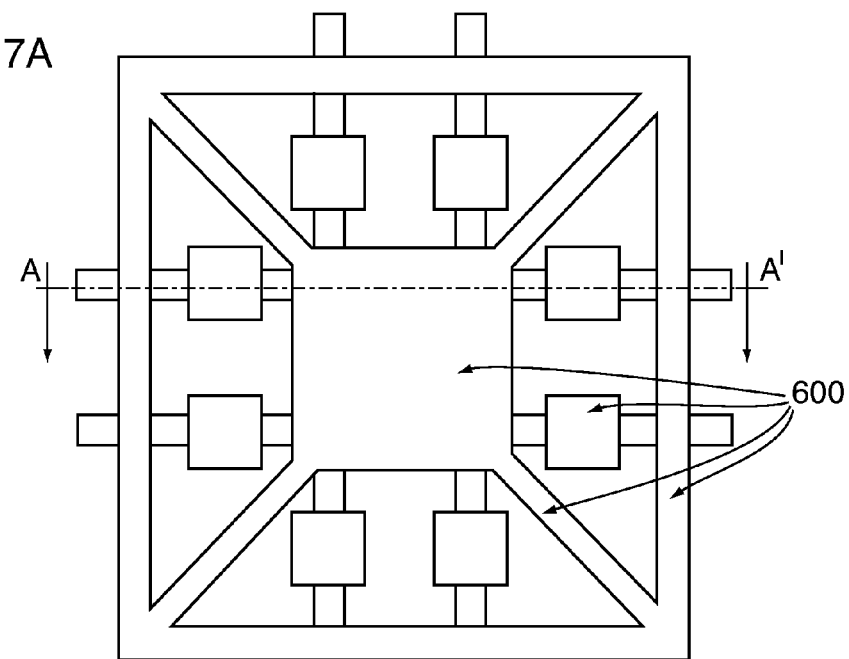
FIGS. 7A-7C are top, bottom and cross-sectional views, respectively, after etching away portions of the copper substrate of FIGS. 6A-6C not covered by the selective etching resist, according to a sixth step of the process set forth in FIG. 1.
Figure 7B:
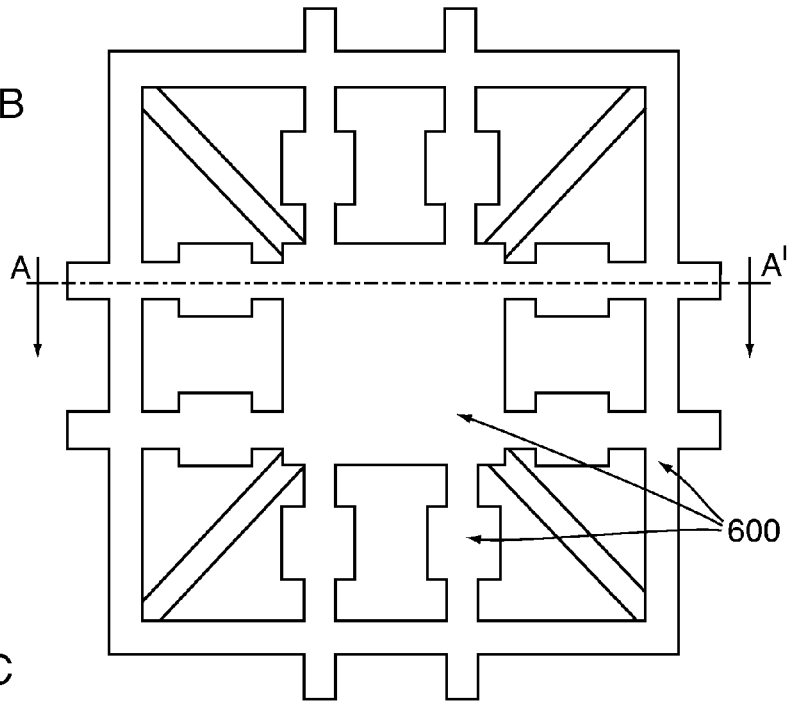
Figure 7C:
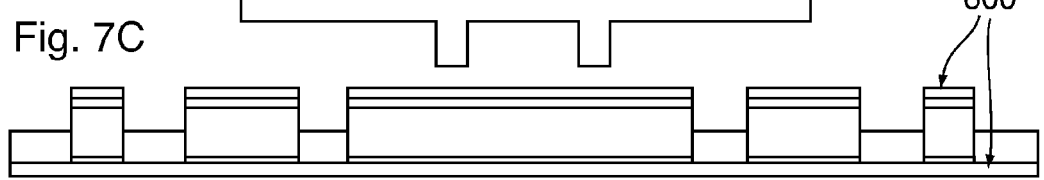

At step 150, the portions of substrate 200 not covered by the selective etching resist 300 are etched away from the top and bottom surfaces at the same etching rate, as shown in FIGS. 7A-7C.

Figure 8A:
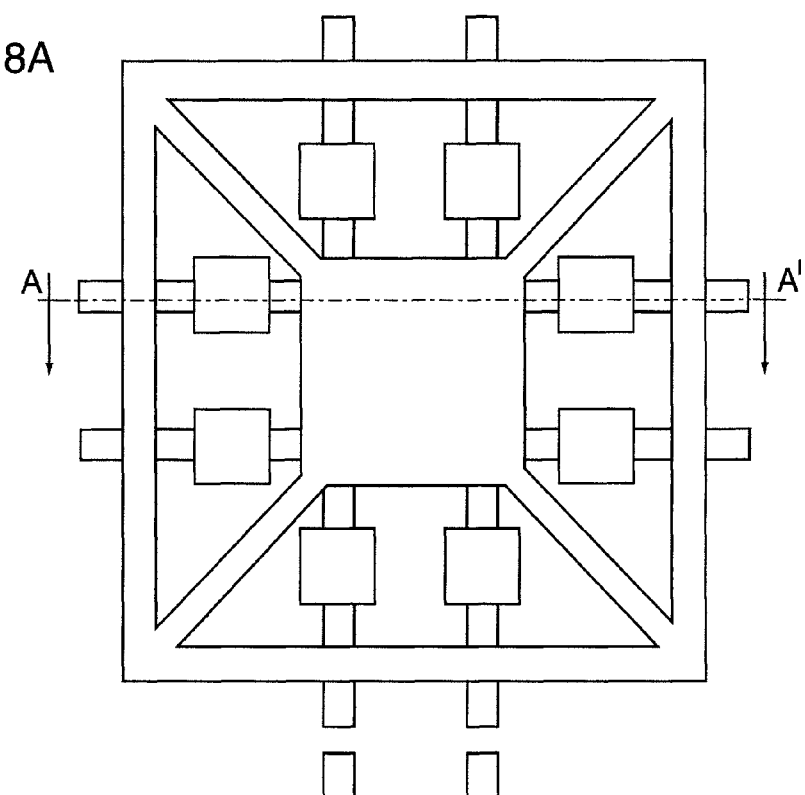
FIGS. 8A-8C are top, bottom and cross-sectional views, respectively, of the substrate of FIGS. 7A-7C after removal of the selective etching resist, according to a seventh step of the process set forth in FIG. 1.
Figure 8B:
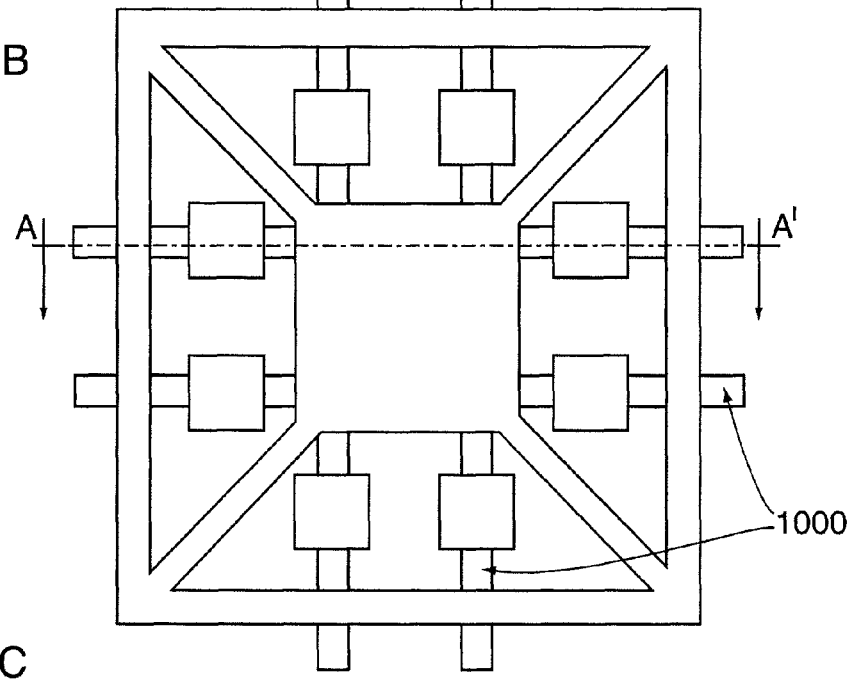
Figure 8C:
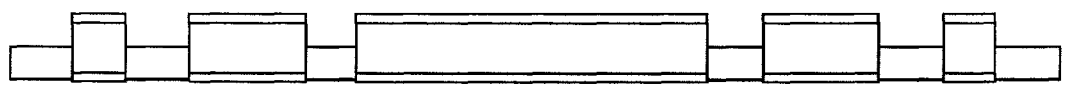

At step 160, the selective etching resist 600 is stripped away, as shown in FIGS. 8A-8C, revealing temporary tie bars 1000 on the bottom surface.

Figure 9A:
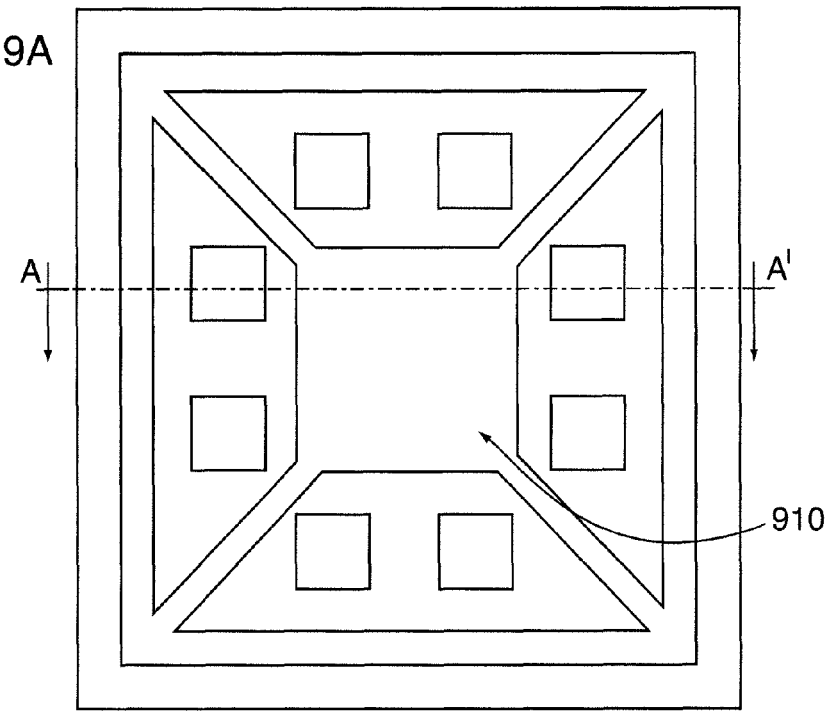
FIGS. 9A-9C are top, bottom and cross-sectional views, respectively, of the substrate of FIGS. 8A-8C after pre-molding of a leadframe thereto, according to an eight step of the process set forth in FIG. 1.
Figure 9B:
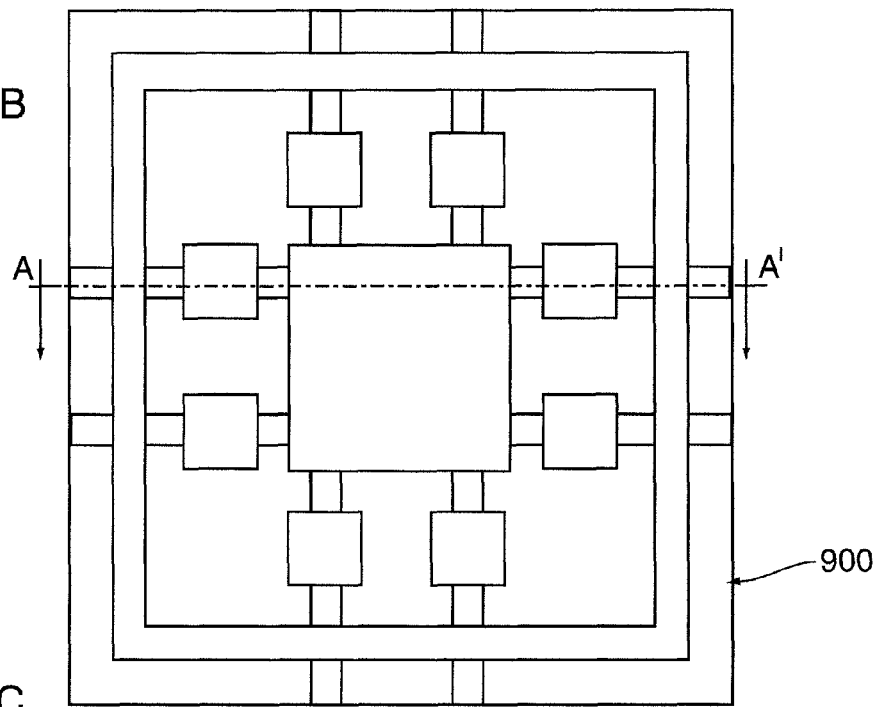
Figure 9C:
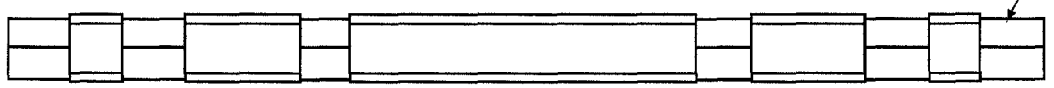

At step 170, a leadframe 900 is pre-molded to the substrate 200, surrounding die attach pad 910, as shown in FIGS. 9A-9C. It will be noted that the leadframe molding is deposited only on portions where there are no metallic features (e.g. contact pads 330, die attach pad 910, etc.), and to a thickness is limited by the temporary tie bars 1000 on the bottom surface.

At step 180, the non-plated temporary tie bars 1000 are etched away from the bottom surface of the substrate using the pre-plated metal as the etching resist remaining after step 120 as a mask, as shown in FIGS. 10A-10C.

Figure 11A:
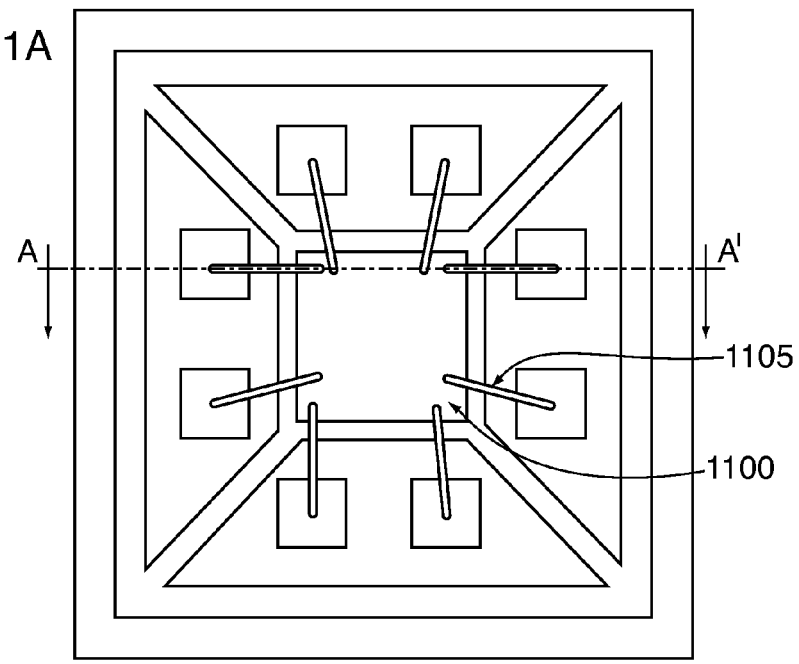
FIGS. 11A-11C are top, bottom and cross-sectional views, respectively, of the substrate of FIGS. 10A-10C following attachment and wire bonding of an integrated circuit, according to a tenth step of the process set forth in FIG. 1.
Figure 11B:
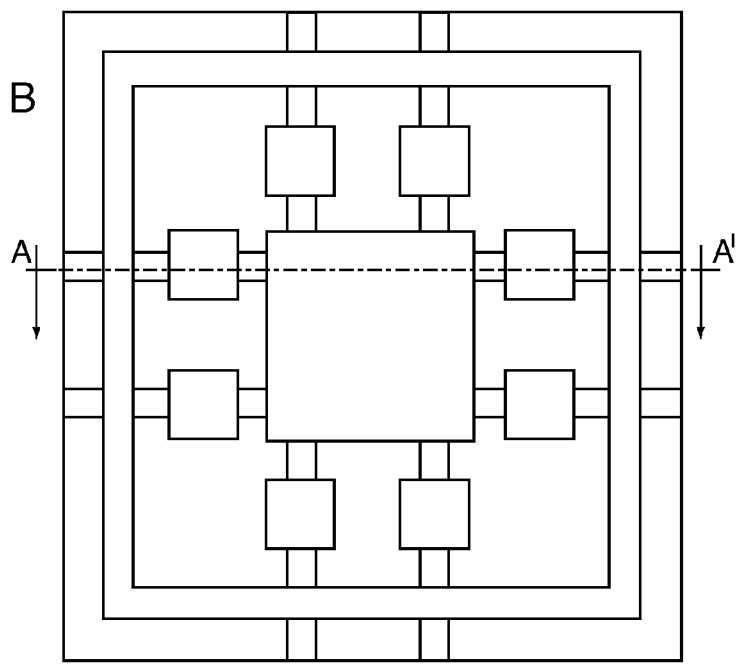
Figure 11C:
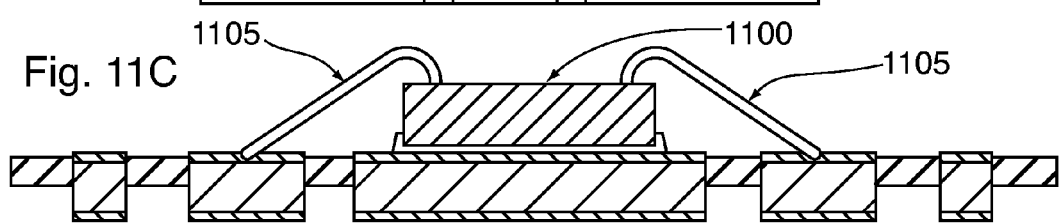

At step 190, integrated circuit 1100 is attached to the pre-molded substrate and wire bonded to input/output (I/O) contact pads via wires 1105, as shown in FIGS. 11A-11C.

Figure 12A:
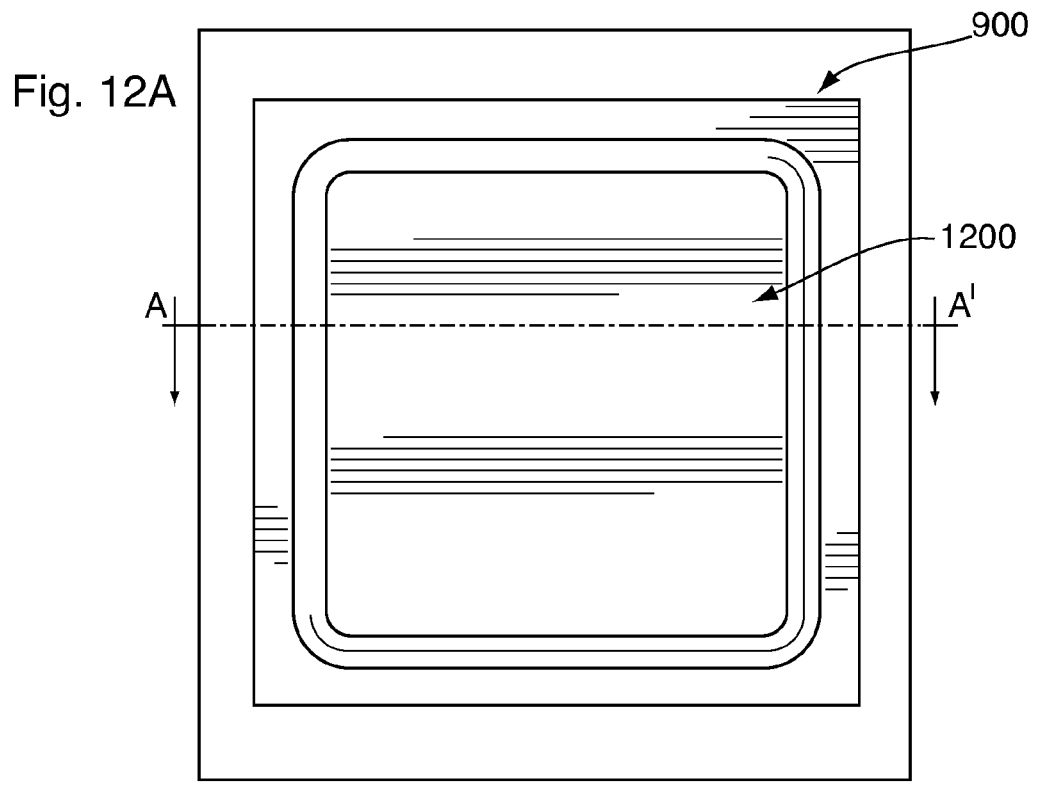
FIGS. 12A-12C are top, bottom and cross-sectional views, respectively, of the cavity package following attachment of a cap to protect the wire-bonded device, according to a last step of the process set forth in FIG. 1.
Figure 12B:
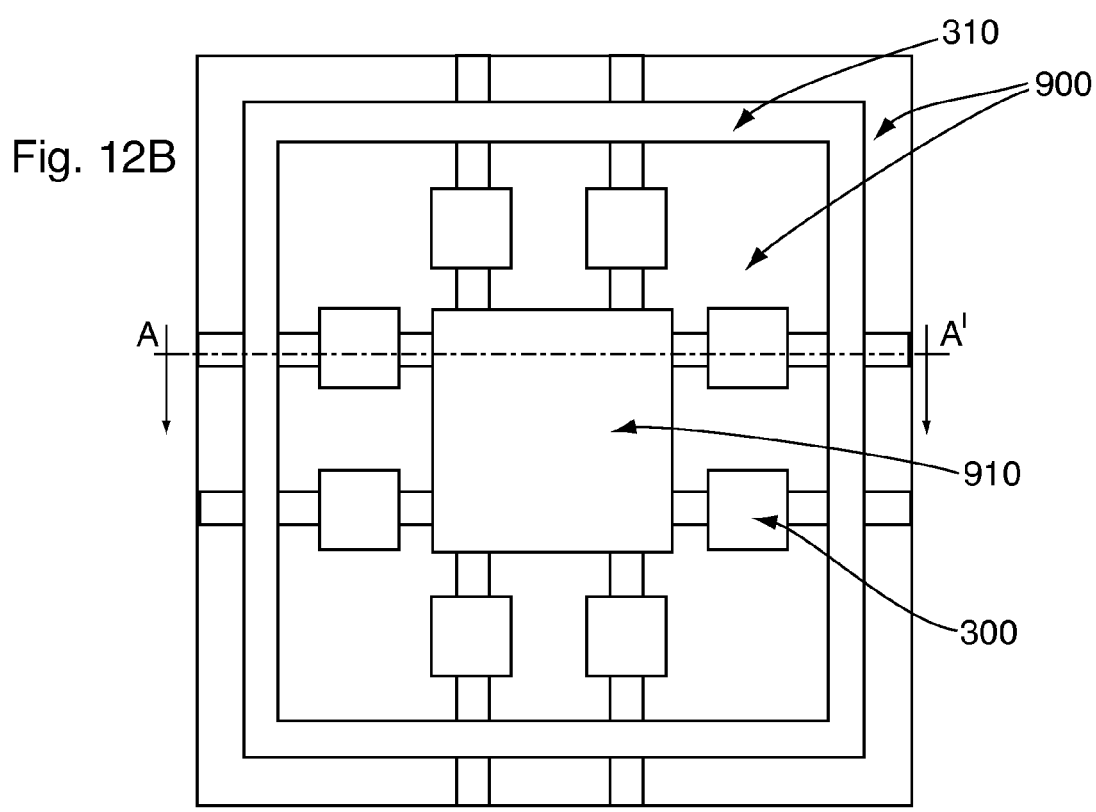
Figure 12C:
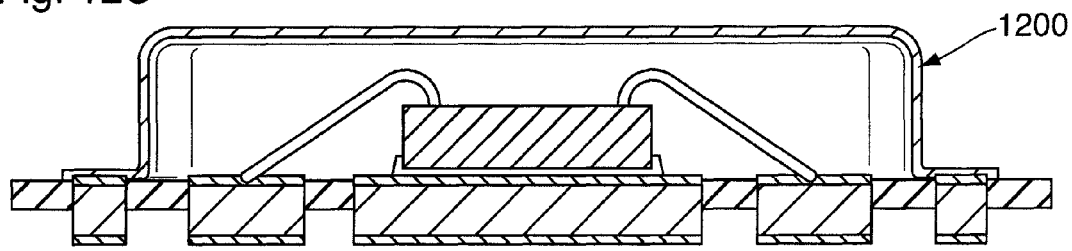
Figure 12D:
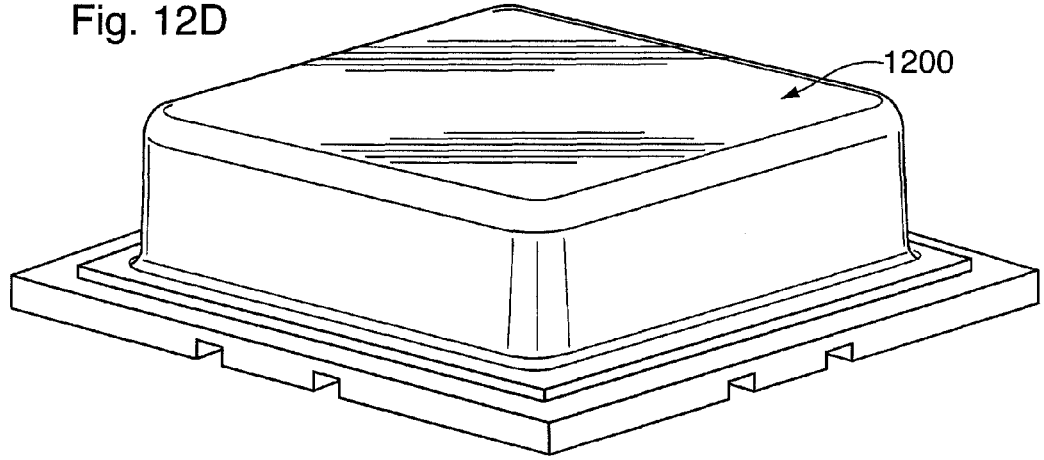
FIGS. 12D and 12E are top and bottom perspective views, respectively, of the cavity package shown in FIGS. 12A-12C.

At step 195, a cap 1200 is attached and electrically connected to the ring 310 and die attach pad 910 of the substrate 200 (e.g. by means of conductive epoxy or solder reflow) to protect the wire bonded device and permit electrical grounding, as shown in FIGS. 12A-12C.

As discussed above, in practice a matrix of cavity packages is fabricated. Therefore, after step 195, the matrix is singulated (e.g. using saw singulation) to create individual packages, such as the single package shown in FIGS. 12D and 12E.

Figure 12E:
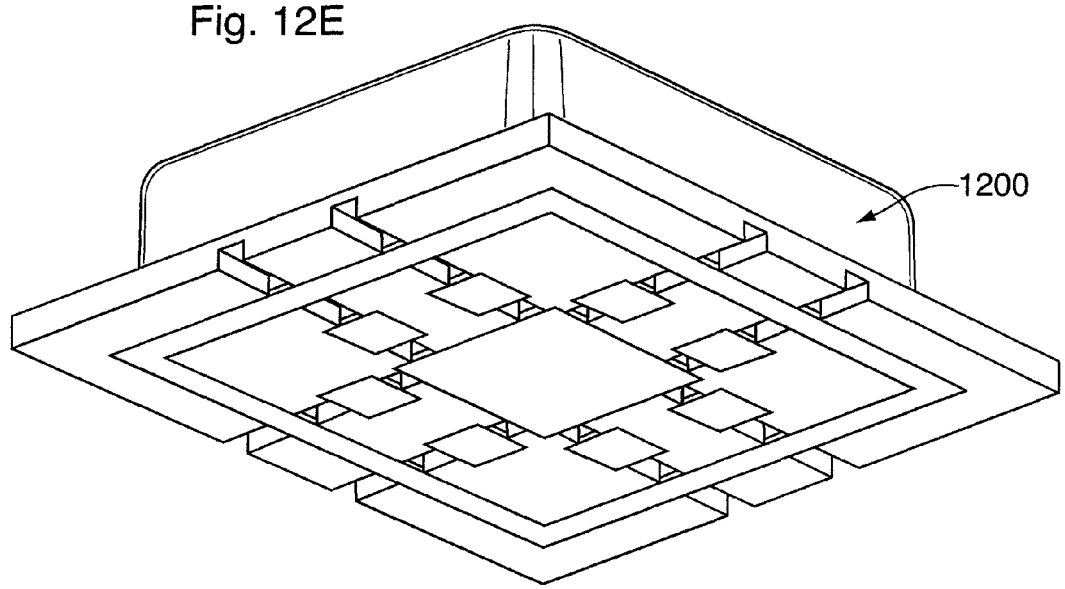

As shown in FIG. 12E, an electrical ground path is created for the die attach pad 910 and the metal cap 1200 through the top ring and copper substrate to the bottom metal ring, in order to protect the I/O contact pads 320, wires and the integrated circuit.

While the forgoing exemplary embodiment is illustrative of the principles of the present invention, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A cavity package, comprising:
   a. a metal plated single-layer substrate patterned to form a plurality of features, the plurality of features including top and bottom rings, a die attach pad that affixes an integrated circuit, a plurality of contact pads, and at least one tie bar that connects the die attach pad to the top ring;
   b. a plastic body molded to the substrate and surrounding the plurality of features; and
   c. a metal cap that closes and encapsulates the plurality of features, the cap being attached to the body via the top ring to provide an electrical ground path for the die attach pad and the metal cap through the top ring and substrate to the bottom ring; wherein
   the plurality of features are located on a top surface and a bottom surface of the metal plated single-layer substrate; and
   the bottom ring is electrically isolated from the die attach pad and the contact pads on the bottom surface of the metal plated single-layer substrate.

2. The cavity package of claim 1, further comprising conductive epoxy that attaches the metal cap to the body.

3. The cavity package of claim 1, further comprising solder that attaches the metal cap to the body.

4. The cavity package of claim 1, wherein the metal plated single-layer substrate is copper plated with Ag.

5. The cavity package of claim 1, wherein the metal plated single-layer substrate is copper plated with Ni/Au.

6. The cavity package of claim 1, wherein the metal plated single-layer substrate is copper plated with Ni/Pd/Au.

* * * * *